Patented Apr. 1, 1969

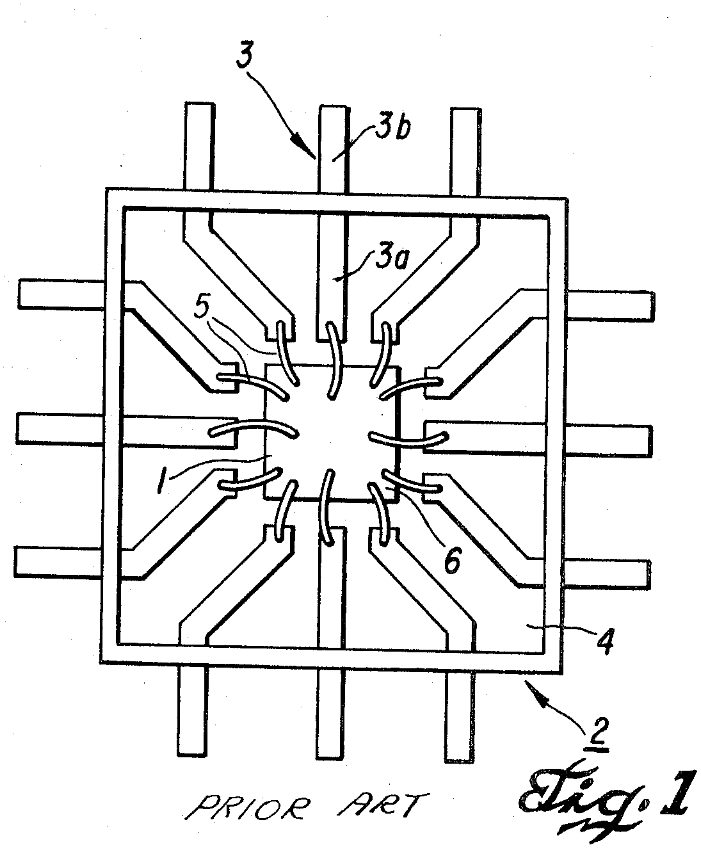
PRIOR ART Fig. 1
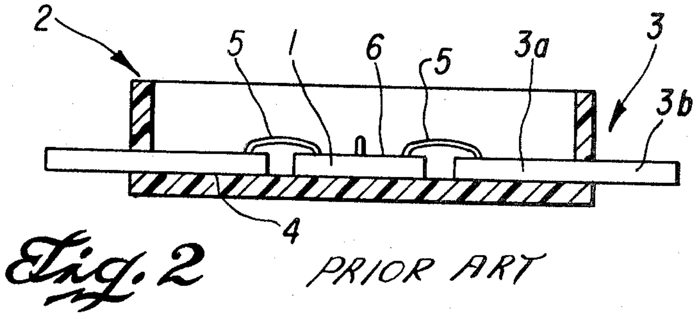
Fig. 2 PRIOR ART
INVENTOR
Bruce S. Reed
Dale T. Wingo
BY Kenneth R. Glaser
ATTORNEY United States Patent Office 3,436,606

3,436,606

PACKAGED MULTILEAD SEMICONDUCTOR DEVICE WITH IMPROVED JUMPER CONNECTION

Bruce S. Reed, Dallas, and Dale T. Wingo, Richardson, Tex., assignors to Texas Instruments Incorporated, Dallas, Tex., a corporation of Delaware Filed Apr. 3, 1967, Ser. No. 628,087
Int. Cl. H02b 1/04
U.S. Cl. 317—101 11 Claims

ABSTRACT OF THE DISCLOSURE

Disclosed is a packaged multilead semiconductor device including a plurality of circuit components in a wafer bonded to the mounting surface of a header. One or more terminal strips, each having a plurality of connections to which connection by jumpers are made from the components in the wafer, are bonded to the header substantially alongside the edges of the wafer, the major surfaces of each terminal strip being in a plane perpendicular to the mounting surface of the header.

This invention relates to semiconductor packaging, and more particularly to a combination of component parts comprising a semiconductor wafer and one or more terminal strips mounted on a header.

As the art of fabricating monolithic integrated circuits advances in the direction of smaller size components and larger grouping or arrays of integrated circuits in a single wafer, as evidenced by such recent developments as the Large Scale Integration concept of integrated circuit functions, the problem of reaching the "outside world" with connecting leads from the increasing number of regions in a monolithic integrated circuit becomes more acute.

In such applications as the LSI circuits, packages (sometimes called "flatpacks") have been utilized with over 100 leads. The conventional flatpack approach in the semiconductor industry today uses a "fan out" technique, with the package leads lying in the same plane as a major surface of the monolithic integrated circuit wafer. Such "fan out" technique involves the use of closely spaced leads near one or more of the four sides of the semiconductor wafer, which first project outwardly in a parallel pattern and then "fan out" to larger spacing between the fanned out leads for connection to, for example, sockets or a printed circuit board.

The fan out of the leads requires large package dimensions in the same plane as the major surface of the semiconductor wafer. In certain cases the increase in width, length or both of the packaged wafer is not detrimental for the packaged units when in use, can be closely packed perpendicularly to the major surfaces of the wafer. However, in certain other applications, such as circuits that require a multitude of light-emitting diode arrays for example, there is very little space available between packages in the same plane as the major wafer surface, thus making the fan out approach impracticable.

Briefly, the invention utilizes the packaging concept of combining one or more terminal strips vertically mounted with respect to a horizontally disposed semiconductor wafer, all the terminal strips and the wafer being bonded to a header or support. Compared to the conventional flatpack, the vertical terminal strips decrease the dimensions in the horizontal plane of the wafer, which are required for extending the leads from the closely spaced regions of the components within the wafer. In applications such as electro-optical arrays mentioned above, the invention permits a much closer packing density of arrays than is possible with the flat pack arrangement.

Accordingly, it is an object of this invention to provide a packaged terminal combination for a semiconductor wafer which does not substantially utilize space in the same plane as the major surface of the wafer.

Another object of the invention is a package combination of semiconductor wafer, header and one or more terminal strips, in which each terminal strip comprises an arrangement of lead connectors disposed therein in a plurality of planes substantially parallel to the mounting surface of the header, and in which the terminal strips themselves are bonded to the header in a substantially perpendicular relation to the mounting surface thereof.

The novel features believed to be characteristic of this invention are set forth with particularity in the appended claims. The invention itself, however, as well as further objects and advantages thereof may best be understood by reference to the following detailed description of illustrative embodiments, when read in conjunction with the accompanying drawings, wherein:

FIGURE 1 is a plan view illustrating an integrated circuit in a flat pack (without a lid) which is used for multilead devices according to the present art;

FIGURE 2 represents a sectional view of the packaged integrated circuit shown in FIGURE 1;

Figure 3:
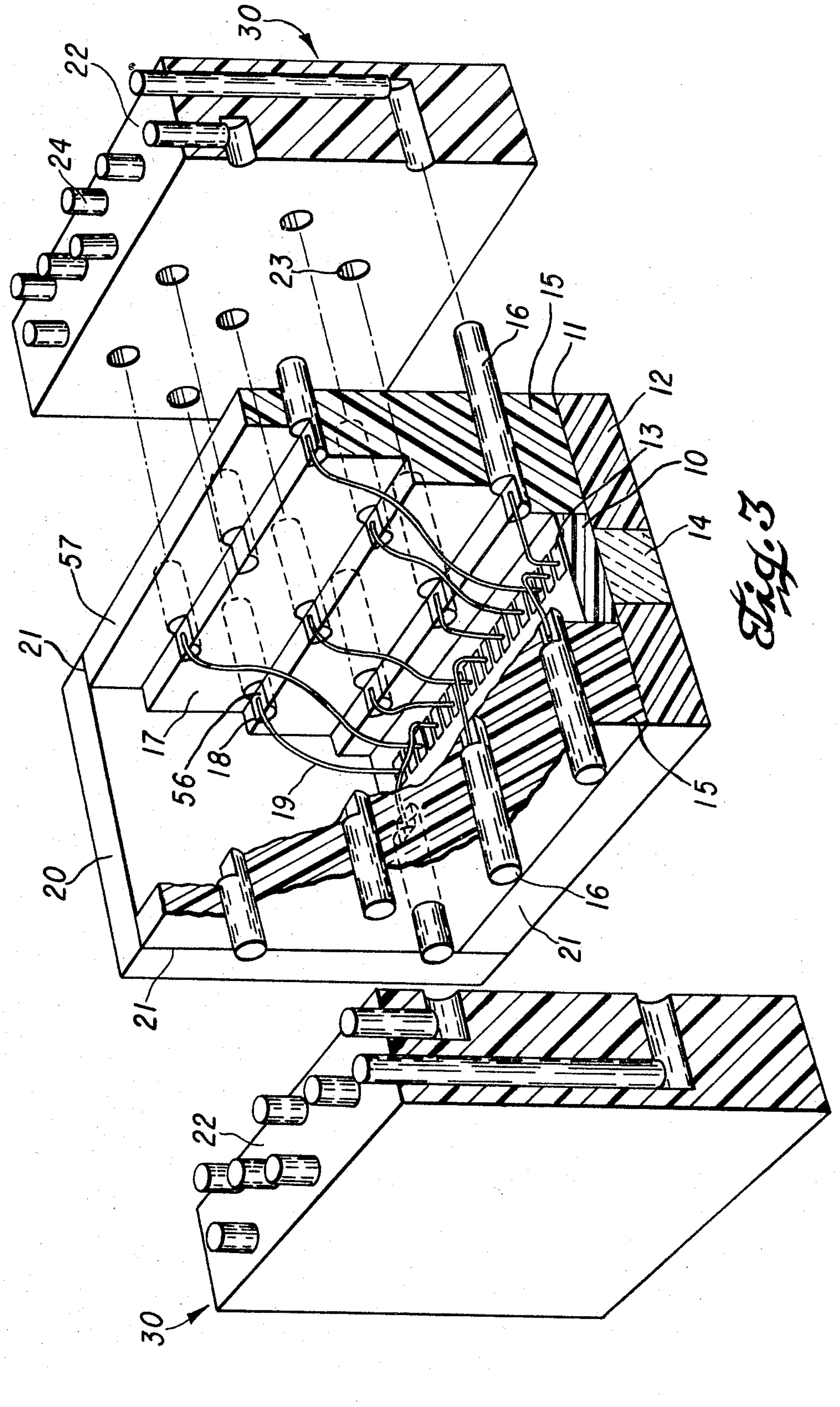
FIGURE 3 is an isometric pictorial representation, partly in section, of one embodiment of a packaged multilead array according to the invention, a portion of the structure being cut away to disclose the interior construction.

Referring now to the figures of the drawings, a packaged monolithic integrated circuit without the lid and made according to the present art is shown in FIGURES 1 and 2. In this example, the header 2 is illustrated as a box-like structure of a suitable insulating material, for example a ceramic, on the base 4 of which is bonded the semiconductor wafer 1 with a multiplicity of circuit components therein (not shown), each component having a plurality of regions. On the base 4 of the header is also bonded a plurality of conductors 3, one for each region in the wafer to which connection to outside of the header is to be made. Each of the conductors 3 has a portion 3*a* extending within the header and a portion 3*b* extending outside the header through a suitable aperture in the side of the header. Connections between the regions in the wafer and the appropriate conductors 3 are effected by thin wire jumpers 5. The header 2 containing the wafer and conductor portions 3a is hermetically sealed by a lid (not shown) or filled with epoxy (not shown) to form the finished packaged device, or "flat pack." It will be observed that the flat pack uses very little space in the direction perpendicular to the surface 6 of the wafer, but uses considerable space in the plane of the surface.

Referring to FIGURE 3, a semiconductor wafer 10 is bonded by one surface to the surface 11 of a support, such as the header 12. The semiconductor wafer 10 contains, by way of example, a multiplicity of light-emitting diodes 13, which necessitates the window 14 located beneath the wafer 10 that is transparent to the wavelength of light emitted by the diodes. The header 12 may be composed of metal-glass, ceramic-glass or plastic. Two trapezoidally configurated terminal strips 15 each made of some insulating material such as glass or plastic, and each formed on one side into an equal number of parallel receding steps, are disposed in parallel relationship to each other on opposite sides of and adjacent the wafer 10 with the steps of each terminal strip facing one another. The straight parallel arrangement of the steps as shown and where necessary is merely one of convenience, however. Other arrangements of the steps are feasible; for example, the steps could be made in the form of waves, for instance sinusoidal waves or any other configuration best suited for easy access from the components in the semiconductor wafer. Moreover, while the strips 15 as shown and described are fabricated with an equal number of steps for all terminal strips in the interests of standardized mass production, the terminal strips may each have a different number of steps, depending upon the total number of connections to be made between the components and the connectors 16 (as described hereinafter) if it is found desirable to have just as many connectors as there are connections to be made thereto from the components.

In this application the major, or longitudinal, dimension of each terminal strip 15 is considered to be the dimension which extends perpendicularly from the surface 11 of the header 12 to the top 57 of the strip 15. The terminal strip 15 is bonded to the surface 11 of the header substantially along side an edge of the wafer by means of its broad base opposite the top surface 57. Hence, when it is stated in this specification that a terminal strip is bonded to the mounting surface of the header in perpendicular relation to said surface, the above is what is meant. Thus, referring to FIGURE 3 by way of example, the steps 17–18 of the strip are considered to be disposed in parallel relation to the mounting surface of the header, whereas the terminal strip as a whole is considered to be bonded to said surface in perpendicular relation thereto.

A plurality of lead connectors 16 each having a notched portion 56 are bonded at different heights from said wafer in each of the terminal strips 15 in rows parallel to each other and to the bonding surface 11. Three rows substantially of lead connectors are indicated in the particular arrangement shown in FIGURE 3, but as before stated, any number of connectors with any desired pattern can be formed in all or in each terminal strip, the number of connectors being limited only by the usable space in the direction perpendicular to the surface 11 of the header. Furthermore and for illustrative purposes only, the multilead array is shown with a semiconductor wafer containing a row of the light emitting diodes 13. The invention is not so limited but may include any multilead semiconductor device including integrated circuits with any combinaton of transistors, resistors, diodes or capacitors either in monolithic, thin film or hybrid form, and with the use of any type of header or support.

As previously described, the opposing inner faces of the terminal strips 15 each comprises a number of receding steps, each step having a riser 18 and a tread 17. The lead connectors 16 are so disposed within the treads of the steps as to be substantially flush with the associated risers, the opposite end from the notched portion 56 of each of said lead connectors extending beyond the back surface of the terminal strip. The rear ends of the lead connectors may be inserted in openings 23 of the snap-on connectors 30, for example, as more fully described hereinafter. The notched portion 56 of each lead connector is exposed for the purpose of vertical lead bonding.

A wire lead 19, or jumper, for each diode 13 is bonded at one end to the notched portion 56 of the appropriate connector lead 16, and also bonded at the opposite end to the associated diode. Of course, there may be a larger number of lead connectors 16 than semiconductor regions to be connected in some applications. In such cases, some lead connectors 16 will be left unconnected. An end member 20 of glass or plastic, for example, is bonded to the surface 21 of each terminal strip and to the surface 11 of the header. In FIGURE 3 the foreground end member 20 is not shown in order to expose the interior construction of the package. The package is completed by bonding a lid (not shown) to both terminal strips 15 and both end members 20, or by filling with plastic the enclosure formed by the terminal strips 15 and the end members 20. For certain applications using light emitting or sensing devices, the lid may also have a transparent window to allow light transmission to the device.

To keep to a minimum the use of space in the same plane as the header surface 11, final connection to the packaged diodes is made in the direction perpendicular to said header surface. A suitable means, for example, is by the connectors 30. Each connector (preferably a rectangular block 22 of any suitable insulating material) has a pattern of apertures 23 therewithin which corresponds to the pattern of lead connectors 16. The openings are of a size such that when each connector 30 is brought into juxtaposition with the back surface of a terminal strip 15, the lead connectors 16 will have completely entered the apertures, from which connector leads 24, embedded vertically into the body of the connector and engaging the ends of lead connectors 16, permit connection of the completed assembly into a socket or a printed circuit board.

Although a separate connector 30 has been described in conjunction with each terminal strip 15 in order to change the direction of the connectors 16 by 90°, it is obvious that such a direction change can be equally effected by using connectors within the terminal strip 15 that have a 90° bend therein, with the end opposite the notched portion 56 emerging from the terminal strip 15 at the surface 57.

The actual shape of the terminal strip 15 as shown in FIGURE 3 is not restricted to any specific configuration. Other suitable shapes of terminal strips are shown in FIGURES 4 and 5 by way of example only, and not by way of limitation.

Figure 4:
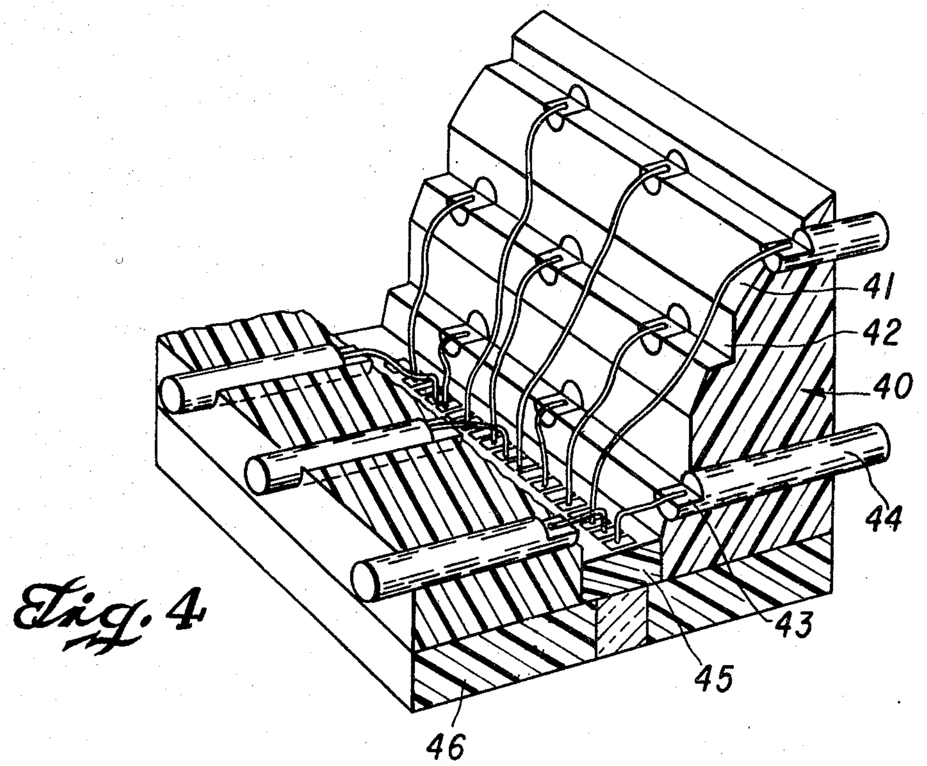
FIGURE 4 is an isometric pictorial representation, partly in section, illustrating another embodiment of the invention.

In FIGURE 4 there is shown a terminal strip 40 with a convex inner surface 41 in which steps 42 are formed in order to expose the notched portions 43 of the lead connectors 44. The terminal strip 40, semiconductor wafer 45, and the header 46 have the same relationship to one another as the one described in conjunction with the package illustrated in FIGURE 3.

Figure 5:
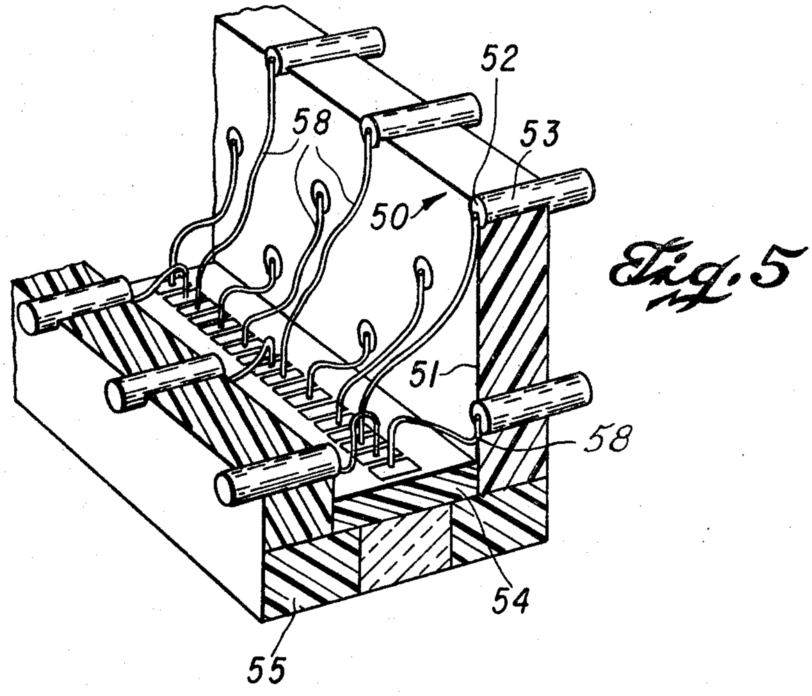
FIGURE 5 is an isometric pictorial representation, partly in section, illustrating yet another embodiment of the invention.

If horizontal lead bonding is used, a terminal strip 50 as shown in FIGURE 5, can be used that has a flat inner surface 51 which exposes a vertical bonding surface 52 of the lead connectors 53, which allows vertical connection with the jumper 58. The terminal strip 50, semiconductor wafer 54 and the header 55 also have the same relationship to one another as the one described in conjunction with FIGURE 3.

Figure 6:
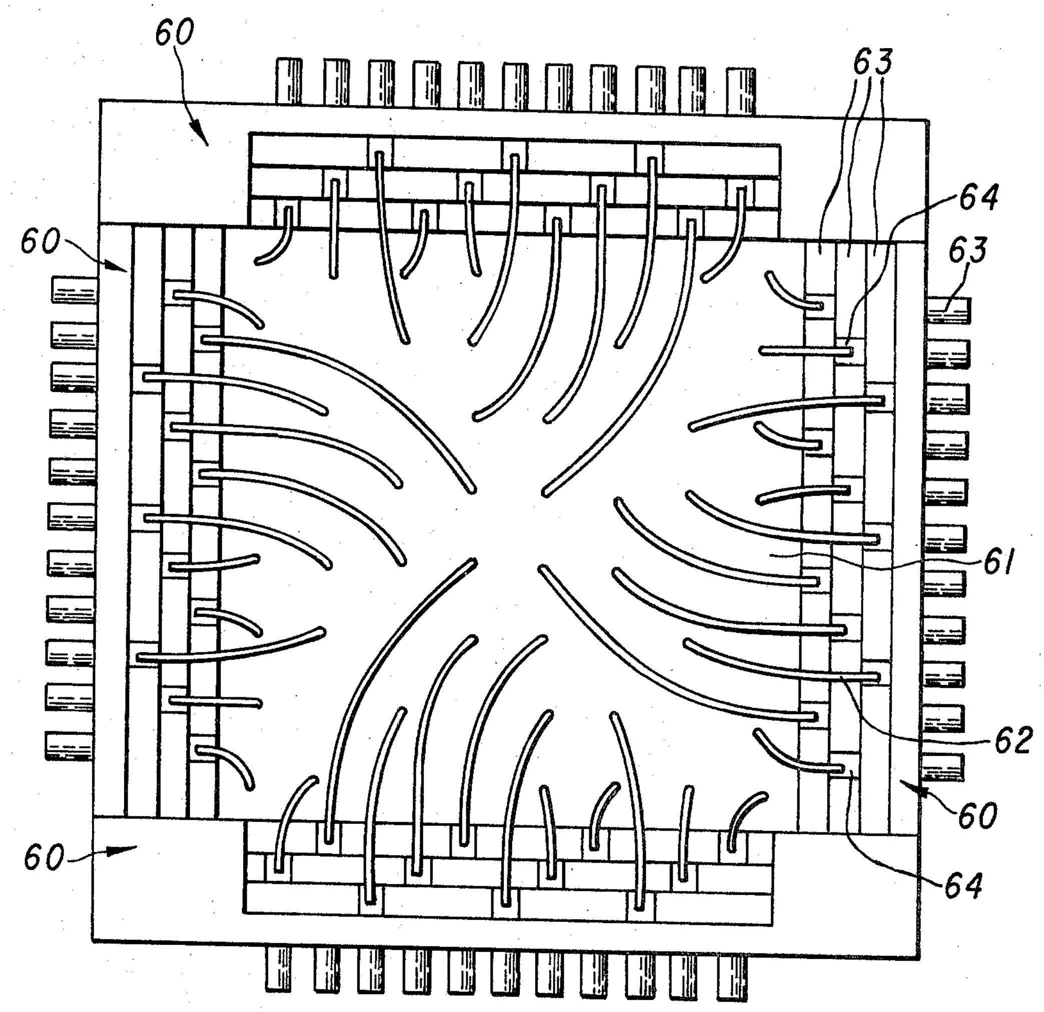
FIGURE 6 is a plan view of a packaged multilead integrated circuit, illustrating still another embodiment of the invention having a terminal strip on all four sides of the semiconductor wafer.

With complex integrated circuits that require more connections than can be provided by the use of two terminal strips, a terminal strip 60 can be used on all four sides of a semiconductor wafer 61 as shown in FIGURE 6.

Jumper wires 62 from the regions (not shown) in the wafer 61 make connection to the notched portions 64 of connectors 63 as previously described with regard to the embodiments of the invention illustrated in FIGURES 3 and 4, said notched portions being exposed in the risers of the terminal strips 60. The lid and snap connectors to complete the assembly are not shown but are essentially the same as those described in the embodiment shown in FIGURE 3.

Various modifications of the invention will become apparent to persons skilled in the art without departing from the spirit and scope of the invention as defined by the appended claims.

What is claimed is:

1. A packaged multilead semiconductor device comprising a support, a semiconductor wafer bonded to a surface of said support, said semiconductor wafer having a plurality of regions therein, at least one terminal strip having a plurality of connectors therein disposed at different heights from said wafer, said connectors being in substantially parallel relation to said bonding surface, said at least one terminal strip being bonded to said support adjacent said wafer, and connection means from said regions to said connectors in said at least one terminal strip.

2. A packaged multilead semiconductor device comprising:

(a) a support, (b) a semiconductor wafer bonded by one surface to a bonding surface of said support, said wafer having a plurality of circuit components therein arranged in at least one row, each component having a plurality of semiconductor regions;

(c) at least one terminal strip of insulating material having therein a plurality of metal connectors disposed at different heights from said wafer, said connectors being in substantially parallel relation to said bonding surface, said at least one terminal strip being affixed to said support adjacent said wafer; and (d) a connection means for certain of said regions of said components to certain of said connectors.

3. A packaged multilead semiconductor device comprising a support, a semiconductor wafer bonded to a surface of said support, said wafer having a plurality of circuit components therein arranged in at least one row, each component having a plurality of semiconductor regions, two terminal strips of insulating material, said terminal strips being located adjacent said wafer with a major face of each terminal strip being in a parallel relationship with said row of circuit components, each of said terminal strips having a plurality of metal connectors disposed at different heights from said wafer, said connectors being in substantially parallel relationship to said surface of said support, and connection means for certain of said regions of said components to certain of said connectors, said connection means between adjacent components being connected to connectors in different terminal strips.

4. A packaged multilead semiconductor device comprising a header, a semiconductor wafer bonded to a surface of said header, said semiconductor wafer having a plurality of regions therein, at least one terminal strip having connectors therein disposed in substantially parallel relation to said bonding surface, said at least one terminal strip being bonded to said surface of said header in substantially perpendicular relation thereto, connection means from said regions to said connectors in said at least one terminal strip, and a portion of each of said connectors opposite the end making contact to said connection means emerging from said at least one terminal strip in perpendicular relationship with the rest of said conductor.

5. A packaged multilead semiconductor device comprising a header, a semiconductor wafer bonded to a surface of said header, said semiconductor wafer having a plurality of regions therein, at least one terminal strip having connectors therein disposed in substantially parallel relations to said bonding surface, said at least one terminal strip being bonded to said surface of said header in substantially perpendicular relationship thereto, the surface of said at least one terminal strip facing said semiconductor wafer being comprised of a plurality of receding steps, said connectors being lodged in the risers of said steps with the ends thereof facing said semiconductor wafer being exposed for bonding to the regions of said wafer, and connection means from said regions to said connectors in said at least one terminal strip.

6. A packaged multilead semiconductor device comprising a header having a glass window, a semiconductor wafer bonded to said window, said semiconductor wafer having a plurality of regions therein, at least one terminal strip having connectors therein disposed in substantially parallel relations to the bonding surface of said window, said at least one terminal strip being bonded to said header in substantially perpendicular relationship thereto, and connection means from said regions to said connectors in said at least one terminal strip.

7. A packaged multilead semiconductor device comprising a header, a semiconductor wafer bonded to a surface of said header, said semiconductor wafer having a plurality of regions therein, at least one terminal strip having connectors therein disposed in substantially parallel relations to said bonding surface, said at least one terminal strip being bonded to said surface of said header in substantially perpendicular relation thereto, connection means from said regions to said connectors in said at least one terminal strip, and a number of end members bonded to said header in perpendicular relationship to the bonding surface of said header, the number of said end members being four less than the number of said at least one terminal strip.

8. The packaged multilead semiconductor device as defined in claim 7, including a lid over said end members and said at least one terminal strip, thereby enclosing said semiconductor wafer.

9. The packaged semiconductor device as defined in claim 8, wherein said lid contains a transparent window.

10. A packaged multilead semiconductor device comprising:

(a) a header having a glass window, (b) a semiconductor wafer bonded to said glass window, said wafer having a plurality of circuit components therein, each component having a plurality of regions;

(c) at least one terminal strip of insulating material having therein a plurality of metal connectors, said connectors surfacing on both major faces of said at least one terminal strip, said major faces of said at least one terminal strip being in a perpendicular relationship with the bonding surface of said glass window, said at least one terminal strip being affixed to said header by a face perpendicular to said major faces; and (d) a connection means for certain of said regions of said components to certain of said connectors.

11. A packaged multilead semiconductor device comprising:

(a) a header, (b) a semiconductor wafer bonded by one surface to a bonding surface of said header, said wafer having a plurality of circuit components therein, each component having a plurality of regions;

(c) at least one terminal strip of plastic having therein a plurality of metal connectors, said connectors surfacing on both major faces of said at least one terminal strip, said major faces of said at least one terminal strip being in a perpendicular relationship with said bonding surface of said header, said at least one terminal strip being affixed to said header by a face perpendicular to said major faces; and (d) a connection means for certain of said regions of said components to certain of said connectors.

References Cited

UNITED STATES PATENTS

| | | | |
|---|---|---|---|
| 3,155,881 | 11/1964 | St. Jean. | |
| 3,190,952 | 6/1965 | Bitko | 174—52 |
| 3,234,320 | 2/1966 | Wong | 174—50.5 |
| 3,271,625 | 9/1966 | Caracciolo. | |
| 3,292,241 | 12/1966 | Carroll. | |
| 3,340,348 | 9/1967 | Clark et al. | 174—52 |

OTHER REFERENCES

IBM Technical Disclosure Bulletin, C. Chiou and F. L. Graner, "Making Decal Interconnections to Semiconductors and Substrates," vol. 8, No. 11, April 1966.

LEWIS H. MEYERS, *Primary Examiner.*

J. R. SCOTT, *Assistant Examiner.*

U.S. Cl. X.R.

174—50.52